United States Patent [19]

Lebris et al.

[11] Patent Number: 5,122,070
[45] Date of Patent: Jun. 16, 1992

[54] ELECTRIC TEST CONNECTOR

[75] Inventors: Henri Lebris, Antony; Patrick Sangleboeuf, Le Mans, both of France

[73] Assignee: Souriau et Cie, Boulogne Billancourt, France

[21] Appl. No.: 662,301

[22] Filed: Mar. 1, 1991

[51] Int. Cl.$^5$ .................................... H01R 13/44
[52] U.S. Cl. ................... 439/140; 324/158 F; 439/912
[58] Field of Search ................ 439/137–140, 439/147, 159, 160, 347, 912; 324/158 F, 158 P

[56] References Cited

U.S. PATENT DOCUMENTS 4.128,739  12/1978  Bernstein ........................ 439/912
5.015,946  5/1991   Janko ............................. 439/140

*Primary Examiner*—Paula A. Bradley
*Attorney, Agent, or Firm*—Larson and Taylor

[57] ABSTRACT

An electric test connector is arranged for temporary for connection with another connector, for checking the electric continuity of units connected to the other connector. It comprises: a pluggable casing and a lock carried by the casing and arranged for retaining the other connector. An electrically insulating plate is movable in the casing along the plugging direction and arranged for abutting connection with the front face of the other connector. The plate is resiliently biased. Electrical contact pins carried by said plate are resiliently biased forwardly towards a position where they have a predetermined amount of projection with respect to the plate. The pins are distributed according to a predetermined pattern corresponding to that of electrical contacts in the other connector.

7 Claims, 1 Drawing Sheet

ELECTRIC TEST CONNECTOR

BACKGROUND OF THE INVENTION

The present invention relates to an electric connector, intended to be temporarily connected to another connector for checking the electric continuity of units and so their ability to operate. It is particularly suitable for use in the automobile industry; in fact, to facilitate checks and trouble-shooting on vehicles, the latter are more and more provided with connectors allowing a check to be made by the simple detection of the presence or absence of a voltage at their contact terminals. These connectors are for example carried by the instrument panel, or a bumper equipped with electric members; they may be provided on wired harnesses, etc...

Connectors are already known fulfilling such functions. They have drawbacks. In particular, the contact terminals of the present day test connectors are generally conventional terminals, whose engagement and disengagement under conditions which are often difficult may damage the tested connector. The test connector, held on the connector to be tested by the current locking means of the connector to be tested, must be removed manually at the end of checking, with the risk of a slanted removal likely to distort the contacts.

SUMMARY OF THE INVENTION

An object of the present invention is to provide an improved test connector; it is a more specific object to eliminate most of the causes of damage to the connectors to be tested.

For this, there is provided a test connector comprising a pluggable casing, having own means for locking onto a connector to be tested, containing an electrically insulating plate resiliently urged towards a forward position and arranged for receiving the front face of the connector to be tested and electric contact pins carried by said plate and urged resiliently towards a position in which they project by a predetermined amount with respect to the plate, said pins being distributed at the same spacing as the electric contacts of the connector to be tested.

Such a connector consequently comprises resilient means having an ejection function at the end of checking, as soon as the casing is unlocked, which are wholly separated from the means providing the electric contact function. The latter function is provided by pins for end contact which do not penetrate inside the contacts of the connector to be used not only with pin-type contacts but also with socket type contacts. The resilient arrangement of the pins allows the dimensional or oppositional variations of the contacts of the connector to be tested to be compensated and guarantees a low electric contact resistance.

The invention will be better understood from the following description of a particular embodiment of the invention, given by way of example. The description refers to the accompanying drawings.

DETAILED DESCRIPTION OF A PREFERRED EMBODIMENT

Figure 2:
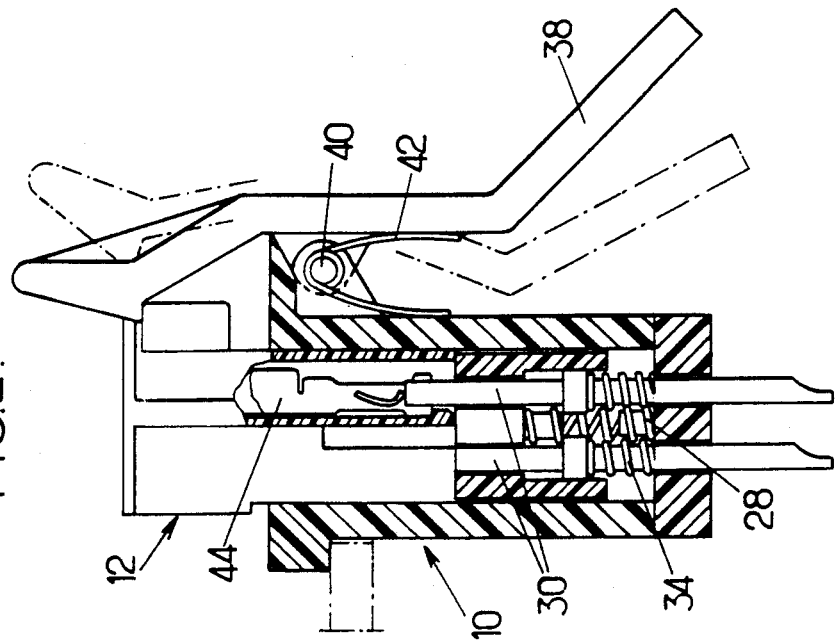
FIG. 2 shows the assembled connectors, in section through II—II of FIG. 1.
Figure 1:
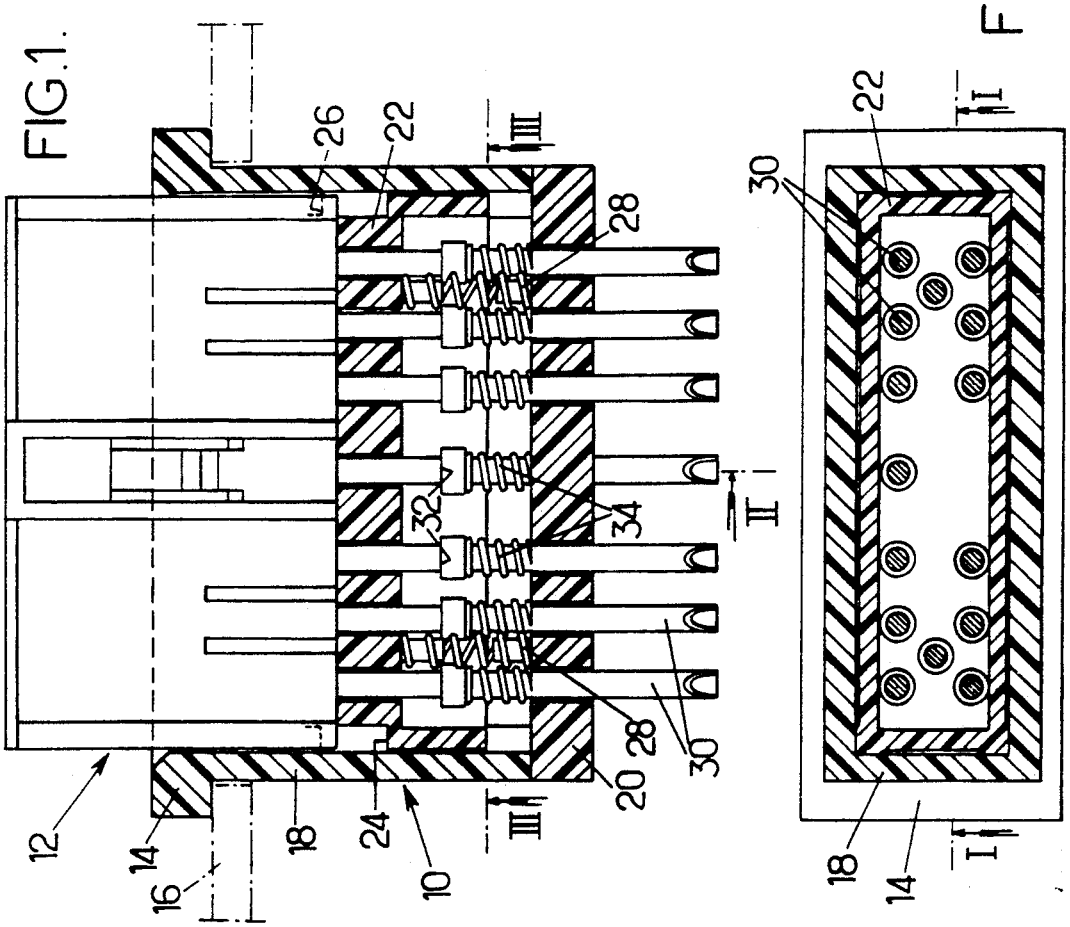
FIG. 1 shows a test connector coupled to a connector to be tested, in cross-section through plane I—I of FIG. 3.
Figure 3:
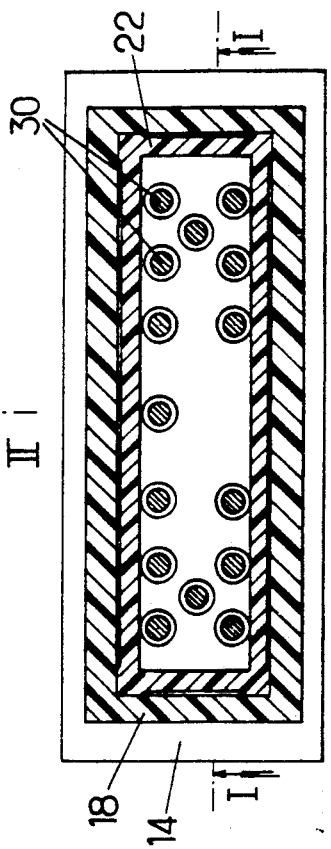
FIG. 3 is a cross-section through line III—III of FIG. 1.

The test connector 10 shown in FIGS. 1 to 3 is for receiving a rectangular connector 12 to be tested. In the embodiment illustrated, the test connector 12 is intended to receive a rectangular connector, comprising contacts distributed in two rows but a test connector could just as well be provided for other types of connectors to be tested.

As shown, connector 10 has a flange 14 for fixing it to a wall 16, but this method of fitting is in no way compulsory.

Connector 10 comprises a casing of insulating material. This casing may be formed in a single piece, for example of molded thermo-plastic material. In the embodiment shown, it is formed of a body 18 with the flange 14 and a bottom wall 20 fixed, for example by screws, on the body. An ejection plate or platen 22 is mounted in the body so as to be able to slide, along the axis of the body, between a retracted position, in which it abuts bottom 20 and a maximum projecting position; when the casing can be disassembled that position may be defined by abutment of a shoulder 24 thereof on an internal flange 26 of body 18. Resilient means urge plate 22 towards its maximum projecting position. In the embodiment illustrated, they comprise two springs 28 compressed between bottom wall 20 and plate 22 and situated in the mid-plane of the connector 10. Pins respectively forced in bottom wall 20 and plate 22 guide the ends of the helical springs 28. The purpose of these springs is to eject connector 12 when it is no longer retained on the connector 10 by locking means, as will be seen later.

The bottom wall 20 of the test connector 10 carries contacts 30 parallel to the axis of the connector and having the same distribution as the contacts of the connector 12 to be tested. The contacts 30 comprise a front portion in the form of a contacting pin, to be applied against the contacts of the test connector 12. The pins have a cross-section such that they may have an abutting connection with the contacts of connector 12, whether these contacts are of the blade, pin or socket type. The rear portion of each contact 30 projects out of the bottom wall and is formed for permanent connection, for instance by soldering, to wires originating from a test bench.

The pins of contacts 30 have a sliding fit in respective openings formed in plate 22. Individual resilient means urge each of contacts 30 towards a position in which the pin has a maximum amount of projection, defined by abutment of a shoulder 32 of the contact against plate 22. In the embodiment shown in FIGS. 1 and 2, the resilient means are formed as individual helical springs 34 compressed between bottom wall 20 and a bulged portion of the contact.

The test connector 10 is advantageously provided with locking means which may be designed to be easily armed and disabled since the size of such means is not relevant. The locking means may be manual or automatically controlled.

In the embodiment shown in FIG. 2, the locking means comprise a lever 38 rotatable on a pin 40 carried by a projecting part of body 18 and able to move between a locking position, in which it is shown in full line in FIG. 2, and a disabled position, in abutment against the body 18 (shown in broken lines on FIG. 2). A spring 42 biases the lever towards its locking position, in which a nose thereof retains the connector to be tested 12 in the fully plugged-in position. The part of the lever with the nose has a slanted input face, so that the connector to be tested 12 can be inserted as far as its fully engaged position. An end plate of lever 38, placed opposite the nose, makes it possible to readily disable the lever.

To avoid an indexing error when inserting the connector to be tested 12, the test connector 10 will generally have fool-proof means, formed for example by a rib (not shown) intended to engage into a corresponding groove of the connector to be tested 12.

A same test connector 10 may receive different connectors to be tested. In fact, some of the pins may remain unused when the connector to be tested has a reduced number of contacts. A dummy may even be placed in the test connector 18 as a substitute for contacts, so that the connector to be tested does not take an abnormal position.

The use of the test connector is clear from the foregoing description. When a connector 12 is to be tested, it is simply inserted into connector 10. During insertion, the nose of lever 38 moves away to let the connector pass. The end face of connector 12 comes into contact with the plate and begins to push it downward, without any force being exerted on the contacts of the connector 12, only one 44 of which is shown schematically in FIG. 2. As the plate 22 moves down towards bottom wall 20, the pins of contacts 30 take a more and more advanced position with respect to the plate. When they project out of the plate, they bear against contacts 44. The springs 34 limit the bearing force exerted on the contacts and avoid any risk of deformation, springs 34 may be calibrated to exert a force which is very much less than that of the ejection springs 28. Connector 12 may be released as soon as it is retained by the nose of lever 38. Because of the presence of springs 34 and because of the pin shape of contacts 30, the junction electrical resistance between the contacts of connectors 10 and 12 is small and the risk of gap is avoided.

To separate the connector to be tested 12 from connector 10, it is sufficient to manually disable lever 38. The ejection springs 38 then drive connector 12 out. It is important to note that the springs 34 have practically no part in ejection.

We claim:

1. Electric test connector, for connection to another connector for checking the electric continuity o units connected to said another connector, comprising:
   a pluggable casing,
   locking means carried by said casing and arranged for retaining another connector to be tested in mated condition,
   an electrically insulating plate movable along a plugging direction and arranged for abutting connection with the front face of said another connector,
   means for resiliently biasing said plate towards a front position, and
   electrical contact pins carried by said plate and resiliently biased forwardly with respect to said plate towards a position where they have a predetermined amount of projection with respect to the plate, said pins being distributed according to a predetermined pattern corresponding to that of electrical contacts in said another connector.

2. Test connector according to claim 1, wherein said predetermined amount of projection is defined by abutment of a shoulder of each of said pins against said plate.

3. Test connector according to claim 1, wherein each of said electrical contact pins is biased forwardly by a force lower than the force of said resilient means by at least one order of magnitude.

4. Test connector according to claim 1, wherein said resilient means comprise ejection springs compressed between said plate and a bottom wall of that casing.

5. Test connector according to claim 4, comprising individual springs each compressed between a shoulder of a respective one of said pins and said bottom wall of the casing for resiliently biasing the electrical contact pins forwardly.

6. An electrical test connector for connection to another connector, comprising:
   a pluggable casing having a bottom wall and a body having an inner surface parallel to a plugging direction,
   an electrically insulating plate received within the casing and slidable along said inner surface for movement along said plugging direction, arranged for abutting connection with a front face of said another connector which is to be tested,
   spring means located between said bottom wall and said electrically insulating plate for resiliently biasing said plate away from said bottom wall toward a forward position,
   a plurality of electrical contact pins parallel to said plugging direction, slidably received in said plate and distributed according to a predetermined pattern corresponding to that of electrical contacts in said another connector, and
   individual springs each compressed between a shoulder of a respective one of said pins and said bottom wall, for resiliently biasing said pins forwardly with respect to said bottom wall and to said plate toward a position where they have a predetermined amount of projection with respect to said plate.

7. A test connector tested connector assembly, wherein said tested connector has a housing and a plurality of electrical contacts distributed according to a predetermined pattern and wherein said test connector comprises:
   a casing arranged to slidably receive said housing of the tested connector,
   an electrically insulating plate movable along a plugging direction and arranged for abutting connection with the front face of the connector to be tested,
   means for resiliently biasing said plate towards said front position,
   electrical contact pins carried by said plates and resiliently biased forwardly with respect to said plate towards a position where they have a predetermined amount of projection with respect to the plate, said pins being distributed according to a predetermined pattern corresponding to that of said electrical contacts said tested connector, and
   locking means for temporarily locking said housing of said tested connector on said casing in a position, where said contact pins are in contact with said electrical contacts of the tested connector.

* * * * *

UNITED STATES PATENT AND TRADEMARK OFFICE
CERTIFICATE OF CORRECTION

PATENT NO. : 5,122,070
DATED : June 16, 1992
INVENTOR(S) : LEBRIS ET AL.

It is certified that error appears in the above—identified patent and that said Letters Patent is hereby corrected as shown below:

Title page, add item [30]

FOREIGN APPLICATION PRIORITY DATA

March 2, 1990 [FR]    France ...... 90 02669

Signed and Sealed this

Third Day of August, 1993

Attest:

MICHAEL K. KIRK

*Attesting Officer*    *Acting Commissioner of Patents and Trademarks*